(12) United States Patent
Oberai

(10) Patent No.: US 10,295,988 B2
(45) Date of Patent: May 21, 2019

(54) ELECTRONIC VIRTUAL LAYER

(71) Applicant: Synopsys, Inc., Mountain View, CA (US)

(72) Inventor: Ankush Bharati Oberai, Mountain View, CA (US)

(73) Assignee: Synopsys, Inc., Mountain View, CA (US)

( * ) Notice: Subject to any disclaimer, the term of this patent is extended or adjusted under 35 U.S.C. 154(b) by 58 days.

(21) Appl. No.: 15/692,840

(22) Filed: Aug. 31, 2017

(65) Prior Publication Data

US 2018/0059643 A1 Mar. 1, 2018

Related U.S. Application Data

(60) Provisional application No. 62/382,117, filed on Aug. 31, 2016.

(51) Int. Cl.
| | |
|---|---|
| *G06F 17/50* | (2006.01) |
| *G06F 3/00* | (2006.01) |
| *G06F 11/00* | (2006.01) |
| *G05B 19/4068* | (2006.01) |
| *G06F 3/0481* | (2013.01) |
| *G06F 11/07* | (2006.01) |
| *G06F 3/0482* | (2013.01) |

(52) U.S. Cl.
CPC ..... *G05B 19/4068* (2013.01); *G06F 3/04815* (2013.01); *G06F 11/0751* (2013.01); *G06F 17/50* (2013.01); *G06F 3/0482* (2013.01); *G06F 17/5045* (2013.01); *Y02P 90/265* (2015.11)

(58) Field of Classification Search
CPC .. G06F 17/50; G06F 17/5045; G06F 3/04815; G06F 3/0482; G06F 11/0751; G05B 19/4068; Y02P 90/265
USPC .......... 716/139, 105, 124, 125, 131; 703/14
See application file for complete search history.

(56) References Cited

U.S. PATENT DOCUMENTS

| | | | |
|---|---|---|---|
| 2010/0205570 A1* | 8/2010 | Chapman | G06F 17/5077 716/55 |
| 2013/0197689 A1* | 8/2013 | Bulle | G05B 19/37 700/192 |

* cited by examiner

*Primary Examiner* — Phallaka Kik
(74) *Attorney, Agent, or Firm* — Alston & Bird LLP

(57) ABSTRACT

A method of performing virtual connectivity change between first and second nets associated with an integrated circuit is presented. The method includes generating a first top view and a first perspective views of a layout of the integrated circuit when a computer is invoked to perform the virtual connectivity change. The method further includes defining layers associated with the first and second nets, and defining a boundary of the virtual connectivity change. The method further includes performing the virtual connectivity change between the first and second nets within the boundary, and generating a second top view and a second perspective view of the layout of the integrated circuit after the virtual connectivity change.

10 Claims, 11 Drawing Sheets
(8 of 11 Drawing Sheet(s) Filed in Color)

ELECTRONIC VIRTUAL LAYER

CROSS-REFERENCES TO RELATED APPLICATIONS

This application claims priority, under 35 U.S.C. § 119(e), from U.S. Provisional Application No. 62/382,117, filed on Aug. 31, 2016, entitled "ELECTRONIC VIRTUAL LAYER", the contents of all of which is incorporated herein by reference in its entirety.

BACKGROUND

During failure analysis (FA) of an integrated circuit (IC) chip, the user identifies a failing net, e.g. a portion of the IC netlist that is not properly functioning. The failure may be caused by a short or open circuit. To confirm the cause of the failure, the user may perform focused ion beam (FIB) operations to repair the failed portion of the chip. Such actions may include two types of FIB operations; i) cutting wires or nets and/or ii) depositing metal to connect wires. The FIB operations may be performed in FA processing or implemented inline in manufacturing processes for the IC. Performing a FIB operation is time consuming and costly for manufacturing processes and often it is a guess to find the failure location. Therefore the user may desire assurance of the electrical connectivity post-FIB and especially seeks to avoid damaging the circuit if it is for an inline FIB operation. Verifying the desired result of the FIB operation before physically performing the FIB operation on the IC is therefore desirable. Unfortunately, the success of current FIB operations is heavily dependent on the user's skills.

Accordingly, there is a need for an electronic design automation (EDA) tool to virtually verify intended FIB operations before the FIB operations are physically performed.

SUMMARY

According to one embodiment of the present invention, a method of performing virtual connectivity change between first and second nets associated with an integrated circuit is presented. The method includes generating a first top view and a first perspective views of a layout of the integrated circuit when a computer is invoked to perform the virtual connectivity change. The method further includes defining layers associated with the first and second nets, and defining a boundary of the virtual connectivity change. The method further includes performing the virtual connectivity change between the first and second nets within the boundary, and generating a second top view and a second perspective view of the layout of the integrated circuit after the virtual connectivity change.

According to one embodiment, the virtual connectivity change is achieved by a virtual metal deposition. According to one embodiment, the virtual connectivity change is achieved by a virtual metal cut.

According to one embodiment of the present invention, a computer program product for performing failure analysis on a chip using focus-ion-beam (FIB) tool is presented. The computer program product includes code for locating a physical portion of a semiconductor chip based on an integrated circuit design associated with the chip to be failure analyzed. The computer program product further includes code for generating a first electronically connected net including the physical portion of the semiconductor chip. The net crosses a multitude of physical layers. The computer program product further includes code for simulating one or more electrical cuts on the physical portion of the chip and generating a second electronically connected net, and code for determining if the second electronically connected net eliminates the chip failure. According to one embodiment, a computer program product for performing chip failure analysis using focus-ion-beam (FIB) tool further includes code for navigating the FIB tool to the physical portion of the chip to perform the physical cut.

According to one embodiment of the present invention, a computer program product for performing chip failure analysis using focus-ion-beam (FIB) tool is presented. The computer program product includes code for locating a physical portion of a semiconductor chip based on an integrated circuit design associated with the chip to be failure analyzed. The computer program product further includes code for generating a first electronically connected net including the physical portion of the semiconductor chip. The net crosses a multitude of physical layers. The computer program product further includes code for simulating one or more electrical deposits on the physical portion of the chip and generating a second electronically connected net, and code for determining if the second electronically connected net eliminates the chip failure. According to one embodiment, a computer program product for performing chip failure analysis using focus-ion-beam (FIB) further includes code for navigating the FIB tool to the physical portion of the chip to perform the physical deposition.

According to one embodiment of the present invention, a system includes an input net control receiver, the input net control receiver receiving an input net control, the input net control comprising a first set of instructions to generate an input net. The system further includes an input net generator, the input net generator generating the input net in a virtual environment, the input net comprising one or more layers. The system further includes a first electrical connectivity analyzer, the first electrical connectivity analyzer determining an electrical connectivity of the input net. The system further includes a net altering control receiver, the net altering control receiver receiving a net altering control, the net altering control comprising a second set of instructions to alter the input net to an output net. The system further includes an output net generator, the output net generator generating the output net in the virtual environment. The system further includes a second electrical connectivity analyzer, the second electrical connectivity analyzer determining the electrical connectivity of the output net. The system further includes an output stage, the output stage sending a machine control to alter the state of one or more machines.

According to one embodiment, the net altering control being a cut type. According to one embodiment, the net altering control being a deposit type. According to one embodiment, the virtual environment is a layout view.

According to one embodiment of the present invention, a method includes performing a trace to highlight polygons of an input net when a computer is invoked to perform the trace, processing the polygons marked by edit boxes by a user, and processing the net traced polygons as constrained by top and bottom layers set for the edit boxes. The method includes ending net tracing at the edit boxes having a cut type, and identifying an overlapping net on the edit boxes having a deposit type.

According to one embodiment, the method further comprises sending a machine control to affect the state of one or more machines. According to one embodiment, the trace is performed in a layout view. According to one embodiment, the trace is an online trace. According to one embodiment, the trace is a LVS trace.

According to one embodiment of the present invention, a computing apparatus includes a processor, and a memory storing instructions that, when executed by the processor, configure the apparatus to; perform a trace to highlight polygons of an input net, process the polygons marked by edit boxes by a user, process net trace polygons as constrained by top and bottom layers set for the edit boxes, end net tracing at the edit boxes having a cut type, and identify an overlapping net on the edit boxes having a deposit type. According to one embodiment, the instructions further configure the apparatus to send a machine control to affect the state of one or more machines.

A better understanding of the nature and advantages of the embodiments of the present invention may be gained with reference to the following detailed description and the accompanying drawings.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION

In accordance with one embodiment of the present invention, conductive traces disposed across multiple layers are displayed after performing virtual electrical cuts and/or deposits on a chip prior to a physical FIB operation. Therefore, guess work and potential costly mistakes due to the destructive nature of FIB operations are substantially reduced.

Disclosed herein are embodiments of a system and process to enable a user to simulate a virtual FIB cut and/or deposit on a circuit layout during a virtual FIB operation, to generate a different electronically connected net. The term "net" or "wire" in this context refers to a direct connection in the netlist from one electrical component or terminal to another electrical component or terminal. Component in this context does not refer to merely an electrically conductive connection, but rather an electrical component that performs other electrical functions besides conducting an electrical signal, such as for example switching, or modifying signals as described in the netlist's circuit description. Further, it is understood that when referring to net it is the computer data representing the net and not the physical conductive trace associated with that net that is being described unless a physical connection is specifically called out. When the net is traced, the virtual cut/deposit areas are presented to the user as an output net. The user may confirm that the electrical connectivity of the output net is correct before performing the corresponding physical FIB operation(s).

The disclosed system and process enable expensive FIB operations to be more efficient and cost effective. Additional precautions such as checking for the creation of floating node etc. may be implemented using a simulated net.

An "online trace" or "layout versus schematic (LVS) trace" is utilized to highlight the layout polygons corresponding to an input net. An electronic virtual layer (EVL) feature processes cut or deposit polygons marked by edit boxes by a user. The edit boxes may have multiple layers for example the poly, metal 2 (MT2), via 2 and metal 1 (MT1) layers. Net trace polygons are processed and the net tracing is stopped at the "cut" type of edit boxes, which cuts an input net into two unconnected nets. An overlapping net is generated utilizing the "deposit" type of edit boxes to connect two previously unconnected nets.

Figure 1:
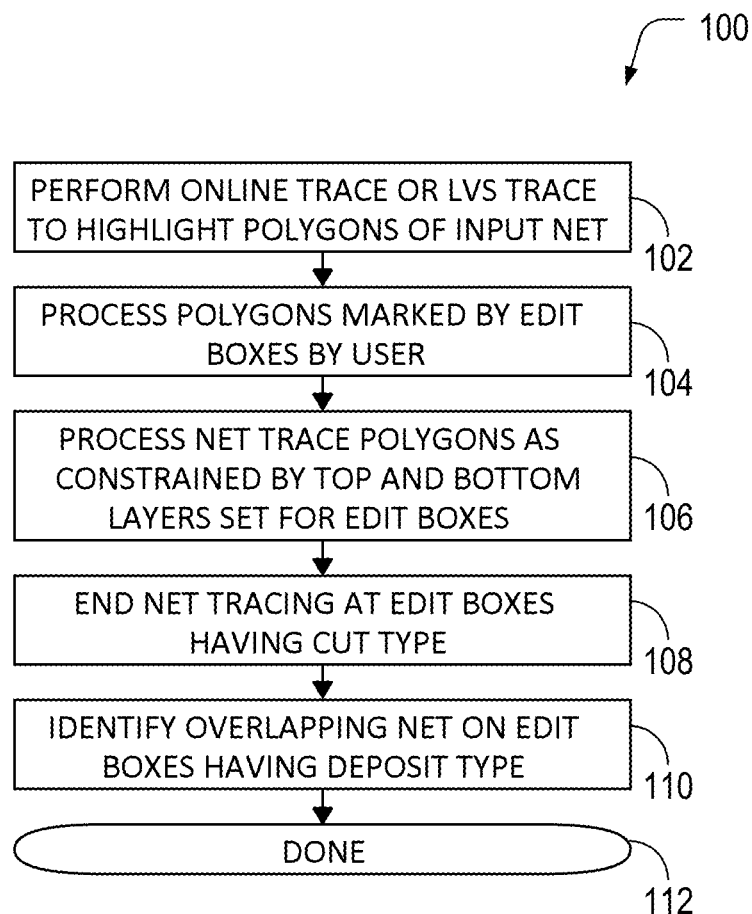
FIG. 1 depicts a simplified exemplary flowchart of a virtual connectivity change process, in accordance with one embodiment of the present invention.

FIG. 1 depicts a simplified exemplary flowchart of a virtual connectivity change process 100, in accordance with one embodiment of the present invention. Virtual connectivity change process 100 may operate on a virtual cut and/or a virtual deposit type FIB operation. Virtual connectivity change process 100 performs 102 an online trace or LVS trace to highlight polygons of an input net, when a computer is invoked to perform virtual connectivity change process 100. The polygons marked by edit boxes received by the EDA tool from a user are processed 104 by the EDA tool. The polygons identified by the net trace in step 102, hereinafter also referred to as "net trace polygons", are processed 106 as constrained by top and bottom layers received by the EDA tool that are set by the user for the edit boxes. The net tracing ends 108 at the edit boxes having a virtual cut type of edit box. An overlapping net is identified 110 on the edit boxes having a deposit type of edit box. Virtual connectivity change process 100 ends at step 112.

In one embodiment, virtual connectivity change process 100 sends a machine control to affect or alter the state of one or more machines. The term "machine" in this context may refer to an EDA tool, such as for example an EDA tool that may be used to identify an attribute or a behavior of the IC as a result of applying virtual connectivity change process 100. In another embodiment, the machine may refer to the FIB tool and the EDA tool may automatically navigate the FIB tool to the physical portion of the chip to perform the physical cut and/or deposition. In one embodiment, the online trace or the LVS trace is performed in a layout view graphical user interface (GUI) environment.

Figure 2:
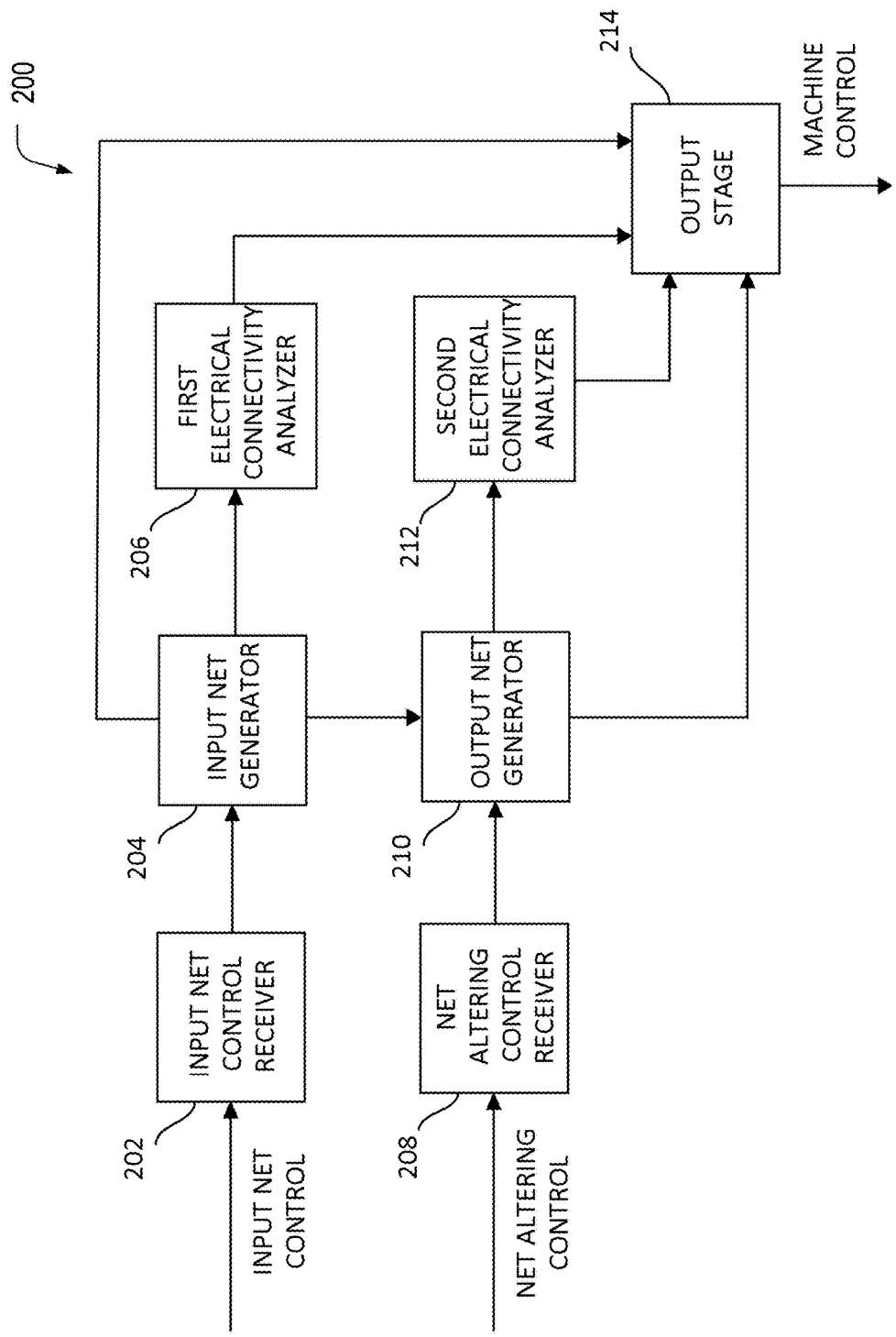
FIG. 2 depicts a simplified exemplary block diagram of a virtual net altering system, in accordance with one embodiment of the present invention.

FIG. 2 depicts a simplified exemplary block diagram of a virtual net altering system 200, in accordance with one embodiment of the present invention. Virtual net altering system 200 comprises an input net control receiver 202, an input net generator 204, a first electrical connectivity analyzer 206, a net altering control receiver 208, an output net generator 210, a second electrical connectivity analyzer 212, and an output stage 214.

Input net control receiver 202 receives an input net control and sends the input net control to input net generator 204. Input net generator 204 receives the input net control from input net control receiver 202. Input net generator 204 generates an input net from the input net control. Input net generator 204 sends controls to first electrical connectivity analyzer 206, output net generator 210, and output stage 214.

First electrical connectivity analyzer 206 receives the control from input net generator 204. First electrical connectivity analyzer 206 determines the electrical connectivity of the input net. First electrical connectivity analyzer 206 sends controls to output stage 214.

Net altering control receiver 208 receives a net altering control and sends the net altering control to output net generator 210. Output net generator 210 receives the input net from input net generator 204 and the net altering control from net altering control receiver 208. Output net generator 210 generates an output net from the input net and the net altering control. Output net generator 210 sends controls to second electrical connectivity analyzer 212 and output stage 214.

Second electrical connectivity analyzer 212 receives the output net from output net generator 210. Second electrical connectivity analyzer 212 determines the electrical connectivity of the output net. Second electrical connectivity analyzer 212 sends controls to output stage 214.

Output stage 214 receives controls from input net generator 204, first electrical connectivity analyzer 206, output net generator 210, and second electrical connectivity analyzer 212. Output stage 214 sends a machine control to affect the state of one or more machines. Virtual net altering system 200 may be operated in accordance with FIG. 1.

Figure 3:
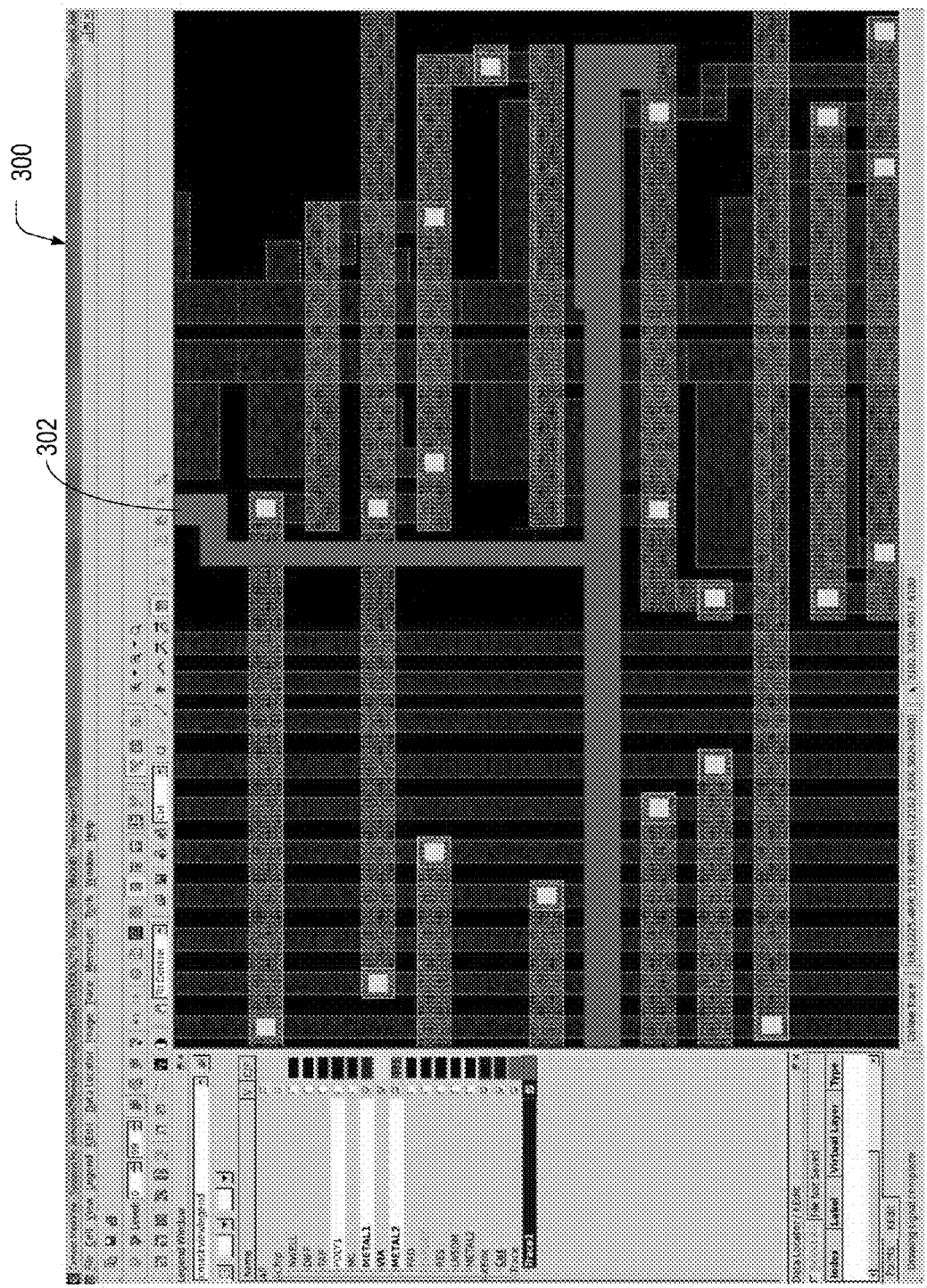
FIG. 3 depicts a simplified exemplary net trace in a top layout view GUI, in accordance with one embodiment of the present invention.

FIG. 3 depicts a simplified exemplary net trace polygon 302 in a top layout view GUI environment 300, in accordance with one embodiment of the present invention. Net trace polygon 302 is depicted in highlighted fill compared to other polygons in this example. Net trace polygon 302 may be generated by an input net control unit, which may receive a user generated input or click at a point on the layout GUI where the trace is to be initiated, after being identified by the net trace in step 102 referenced in FIG. 1.

Figure 4:
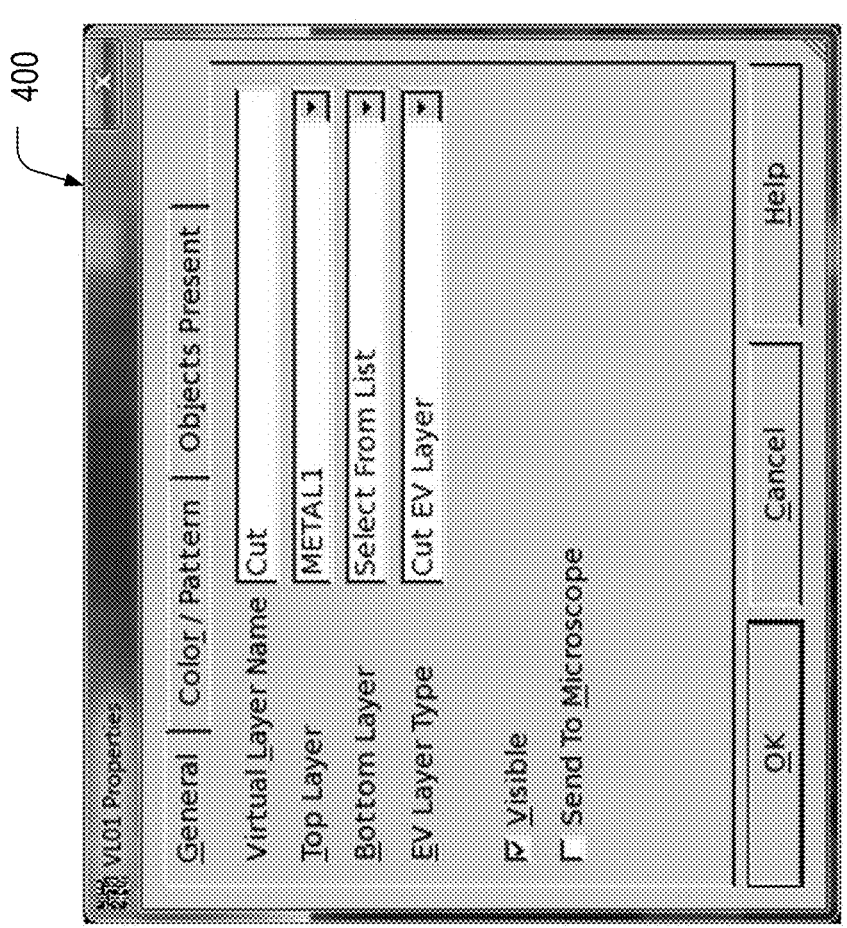
FIG. 4 depicts a simplified exemplary net altering control GUI, in accordance with one embodiment of the present invention.

FIG. 4 depicts a simplified exemplary net altering control GUI 400, in accordance with one embodiment of the present invention. Net altering control 400 may comprise a multitude of user alterable input boxes or fields that define a multitude of characteristics associated with an example EVL feature that is, in-turn, associated with the edit box polygon that indicates where the virtual FIB cut and/or deposit is to be processed by the EDA tool. Net altering control GUI 400 includes an EV Layer Type field, a Virtual Layer Name field, a Top Layer field, and a Bottom Layer field.

In this example, the EV Layer Type field is received by the EDA tool when the user selects "Cut EV Layer" from the available drop down choices to indicate a virtual cut type FIB operation is desired and is defined across multiple layers that will be virtually cut. A Virtual Layer Name field is input by the user as "Cut" to succinctly identify the layer in the EDA environment.

Physical FIB cuts take place in three dimensions on the IC chip through one or more physical layers, each associated with a different layout layer in the EDA system. The edit box polygon is associated with the one or more layout layers to be virtually cut. Accordingly, net altering control GUI 400 includes two fields, namely, the Top Layer field and the Bottom Layer field that define which layout layers are to be cut. The virtual cut type operation will inclusively cut all the layout layers specified between and including the Top Layer field and the Bottom Layer field. In the depicted example, net altering control GUI 400 indicates that the user selects "METAL 1" layer for the Top Layer, while the Bottom Layer field is yet to be selected by the user from a drop down list of available layers. For a virtual deposit type FIB operation (not depicted), the Virtual Layer Name can be chosen as "Deposit" and the EV Layer Type field is user selected as "Deposit EV Layer".

Figure 5:
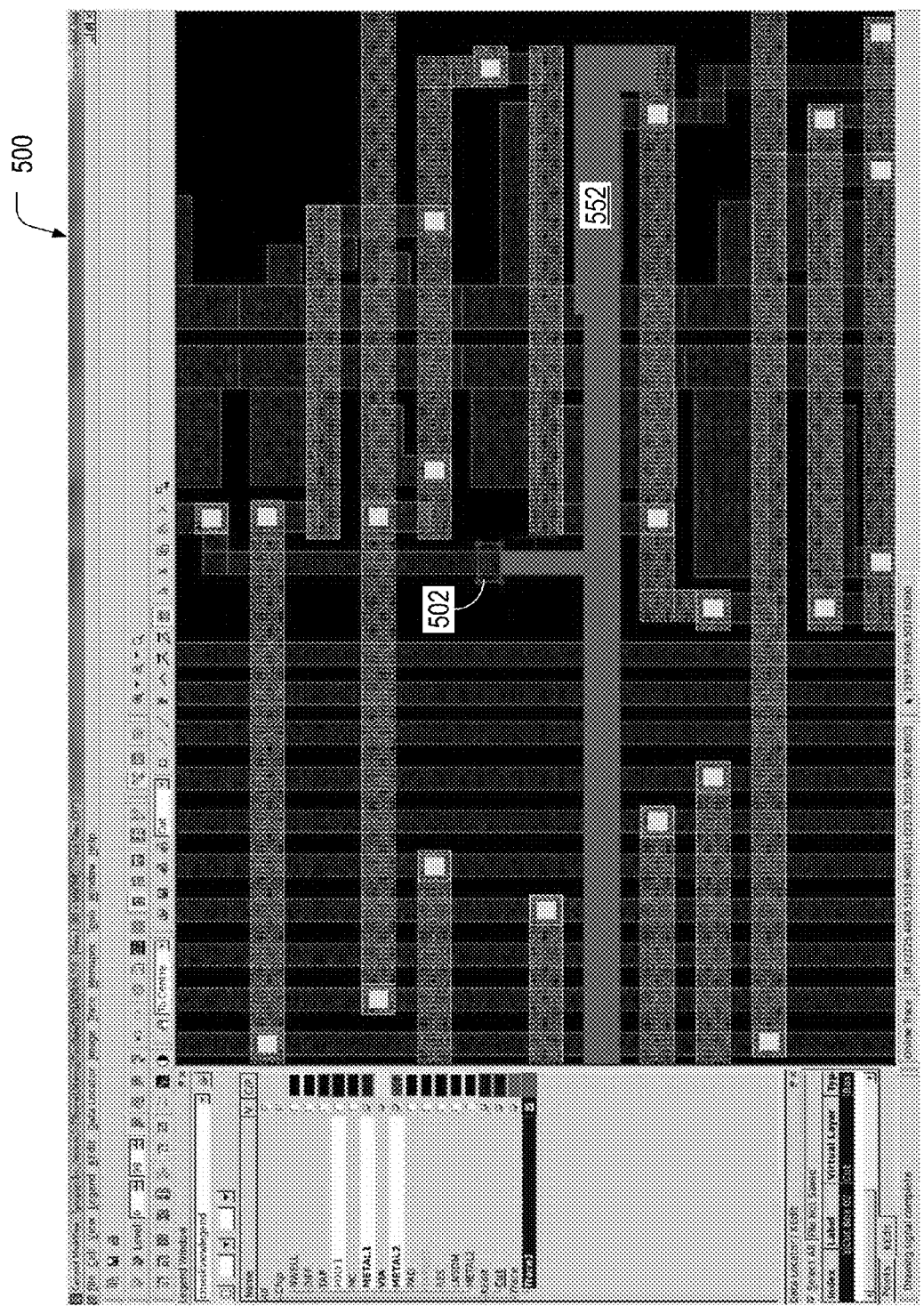
FIG. 5 depicts a simplified exemplary top layout view GUI previously depicted in FIG. 3 after performing a virtual cut type FIB operation, in accordance with one embodiment of the present invention.

FIG. 5 depicts a simplified exemplary top layout view GUI 500 previously depicted in FIG. 3 after performing a virtual cut type FIB operation, in accordance with one embodiment of the present invention. Top layout view GUI 500 includes all the features and functions as top layout view GUI 300 with the following exceptions. Top layout view GUI 500 includes a cut edit box 502 associated with a virtual cut type FIB operation. Referring simultaneously to FIGS. 3 and 5, cut edit box 502 defines a boundary such that when an output net is traced that is associated with net trace polygon 302, the output net now ends at the boundary of cut edit box 502 resulting in second net trace polygon 552. In other words, the portion of net trace polygon 302 depicted above and including cut edit box 502 is no longer part of second net trace polygon 552 after the virtual cut type FIB operation.

Figure 6:
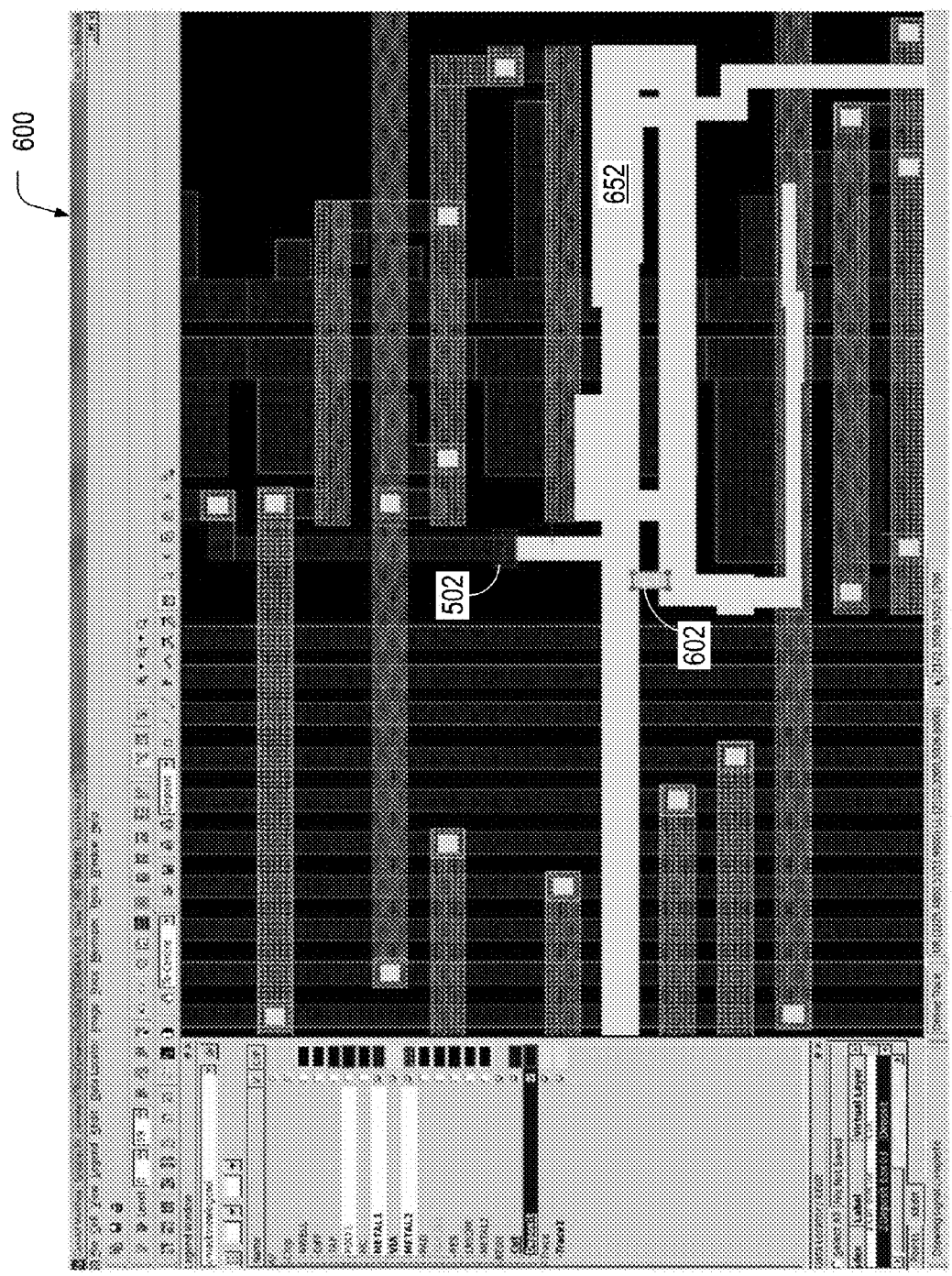
FIG. 6 depicts a simplified exemplary top layout view GUI previously depicted in FIG. 5 after performing both virtual cut and virtual deposit type FIB operations, in accordance with one embodiment of the present invention.

FIG. 6 depicts a simplified exemplary top layout view GUI 600 previously depicted in FIG. 5 after performing both virtual cut and virtual deposit type FIB operations, in accordance with one embodiment of the present invention. Top layout view GUI 600 includes all the features and functions as top layout view GUI 500 with the following exceptions. Top layout view GUI 600 includes a deposit edit box 602 associated with a virtual deposit type FIB operation.

Referring simultaneously to FIGS. 3, 5, and 6, deposit edit box 602 defines an overlapping net or connection between two previously unconnected input nets. In this example, deposit edit box 602 overlaps with both second net trace polygon 552 that is associated with the first net, and a polygon depicted below but immediately adjacent net trace polygon 552 that is associated with a second net. After being placed by the user as described above, deposit edit box 602 enables the EDA tool to identify the new overlapping net, which includes both the first and second nets.

The overlapping net is associated with net trace polygons identified in top layout view GUI 600. Accordingly, top layout view GUI 600 includes highlighted net trace polygon 652 that, in-turn, includes both second net trace polygon 552 and the additional trace polygon associated with the second net. The computer EDA program or tool identifies the overlapping net in accordance with deposit edit box 602 by determining the electrical connectivity of the top layout view GUI 600, which has been edited by the user to include deposit edit box 602 to virtually connect the desired nets simulating the effect of a deposit type FIB operation.

Figures 7A, 7B:
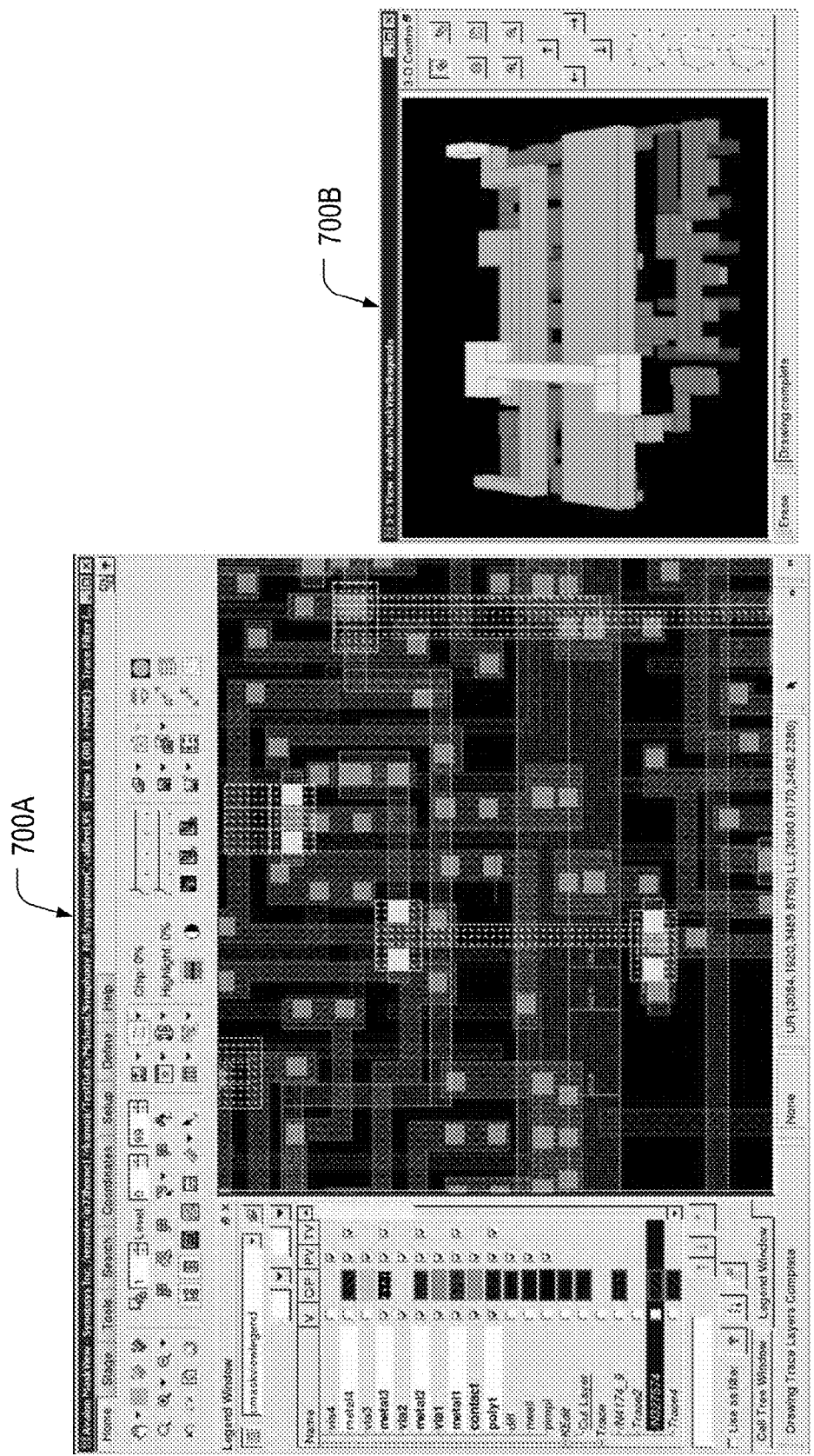
FIG. 7A depicts a simplified exemplary second top layout view GUI of nets, e.g. traces, and vias associated with an integrated circuit before any virtual cut and virtual deposit type FIB operations, operable by embodiments of the present invention.
FIG. 7B depicts a simplified exemplary perspective 3D layout view GUI of the second top layout view GUI previously depicted in FIG. 7A, operable by embodiments of the present invention.

A cut operation often involves cutting across multiple layers as will be described below. FIG. 7A depicts a simplified exemplary second top layout view GUI 700A of nets, e.g. traces, and vias associated with an integrated circuit before any virtual cut and virtual deposit type FIB operations, operable by embodiments of the present invention. FIG. 7B depicts a simplified exemplary perspective 3D layout view GUI 700B of the second top layout view GUI 700A previously depicted in FIG. 7A, operable by embodiments of the present invention.

Figures 8A, 8B:
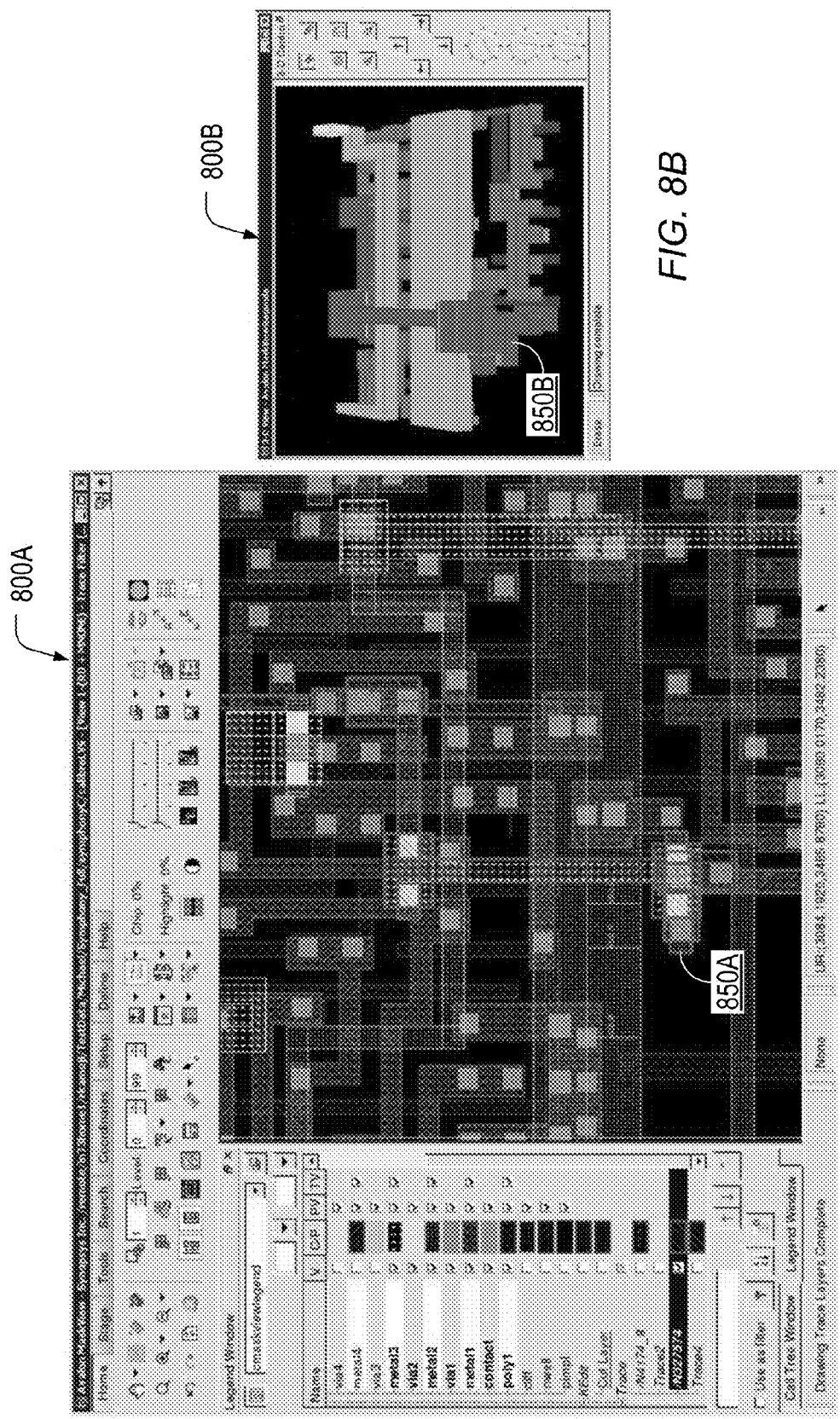
FIG. 8A depicts a simplified exemplary top layout view GUI of the second top layout view GUI previously depicted in FIG. 7A after one net disposed therein is traced and highlighted, in accordance with one embodiment of the present invention.
FIG. 8B depicts a simplified exemplary perspective 3D layout view GUI of the perspective 3D layout view GUI previously depicted in FIG. 7B after one net disposed therein is traced and highlighted, in accordance with one embodiment of the present invention.

FIG. 8A depicts a simplified exemplary top layout view 800A of the second top layout view GUI 700A previously depicted in FIG. 7A after one net 850A disposed therein is traced and highlighted, in accordance with one embodiment of the present invention. FIG. 8B depicts a simplified exemplary perspective 3D layout view GUI 800B of the perspective 3D layout view GUI 700B previously depicted in FIG. 7B after one net 850B disposed therein is traced and highlighted, in accordance with one embodiment of the present invention. One net 850A and one net 850B represent the same net but in respectively different layout views. The left sides of FIGS. 7A and 8A depict a list of conductive layers from front end poly1 in gate structure to backend interconnects in various colors and symbols used in both the top and perspective layout views. Using a perspective 3D View, in accordance with embodiments of the present invention, a virtual electronic layer view, as shown in FIGS. 7A through 8B, helps a user to realize and simulate the connecting layers before a physical cut type FIB operation takes place.

Figure 9B:
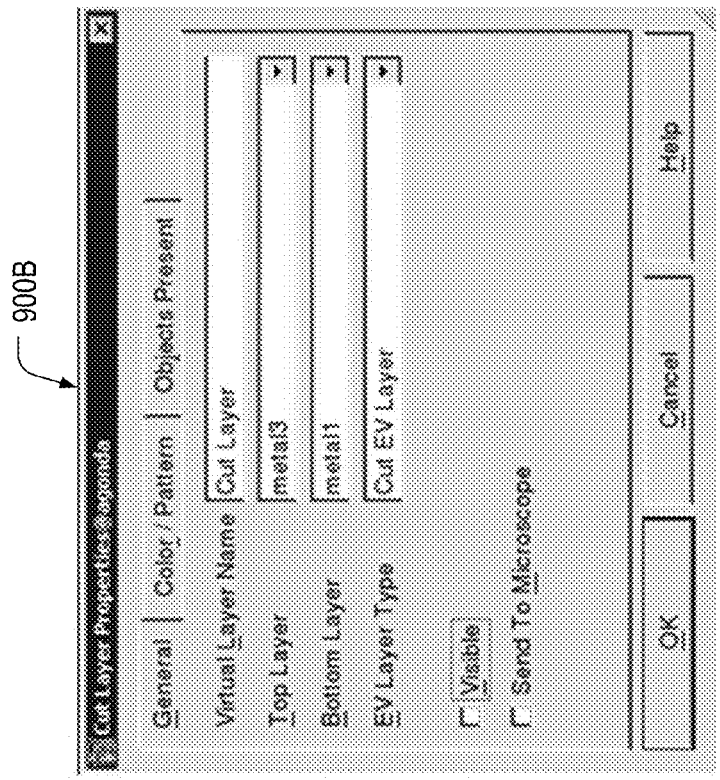
FIG. 9B depicts a simplified exemplary second net altering control GUI, in accordance with one embodiment of the present invention.
Figure 9A:
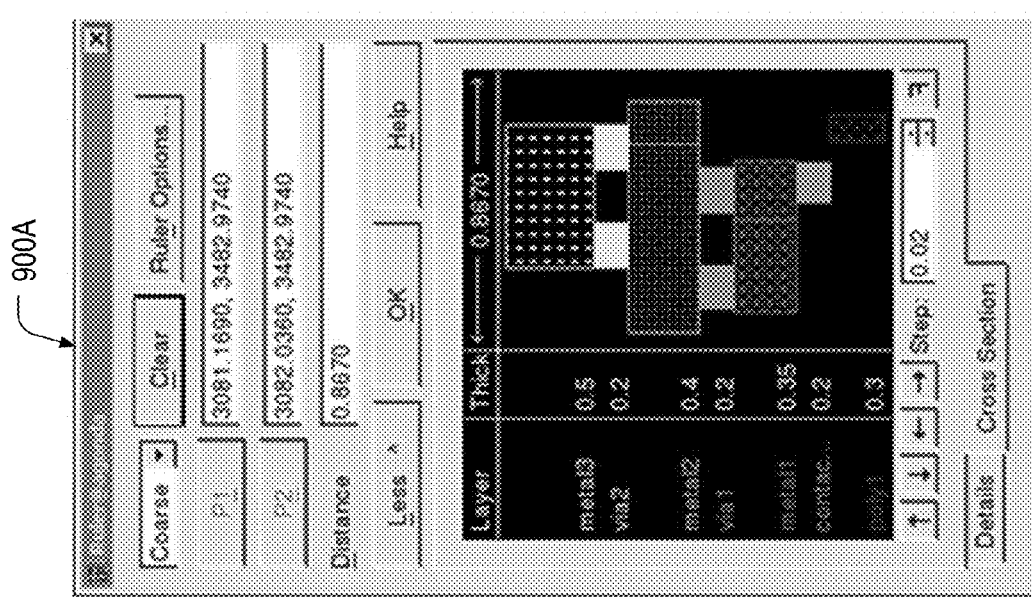
FIG. 9A depicts a simplified exemplary ruler GUI used to control and achieve virtual cutting and/or deposition steps including edit box coordinates and cross sectional dimensions, in accordance with one embodiment of the present invention.

FIG. 9A depicts a simplified exemplary ruler GUI 900A used to control and achieve virtual cutting and/or deposition steps including edit box coordinates and cross sectional dimensions, in accordance with one embodiment of the present invention. Ruler GUI 900A includes a multitude of fields including coordinate fields associated with a multitude of edit boxes, and a multitude of dimensions for different associated thicknesses of various interconnect layers, such as metal3, via2, metal 2, via1, metal1, contact, and poly1. Ruler GUI 900A further includes a cross section display of the multitude of interconnect layers that is to scale.

FIG. 9B depicts a simplified exemplary second net altering control GUI 900B, in accordance with one embodiment of the present invention. Second net altering control GUI 900B includes all the features and functions as net altering control GUI 400 with the following exceptions. The parameters shown in FIGS. 9A and 9B define the coordinates of the virtual cut as well as the metal layers that are subject of the virtual cut. In this example, the virtual cut is defined to occur in metal layers 1, 2, and 3.

Figures 10A, 10B:
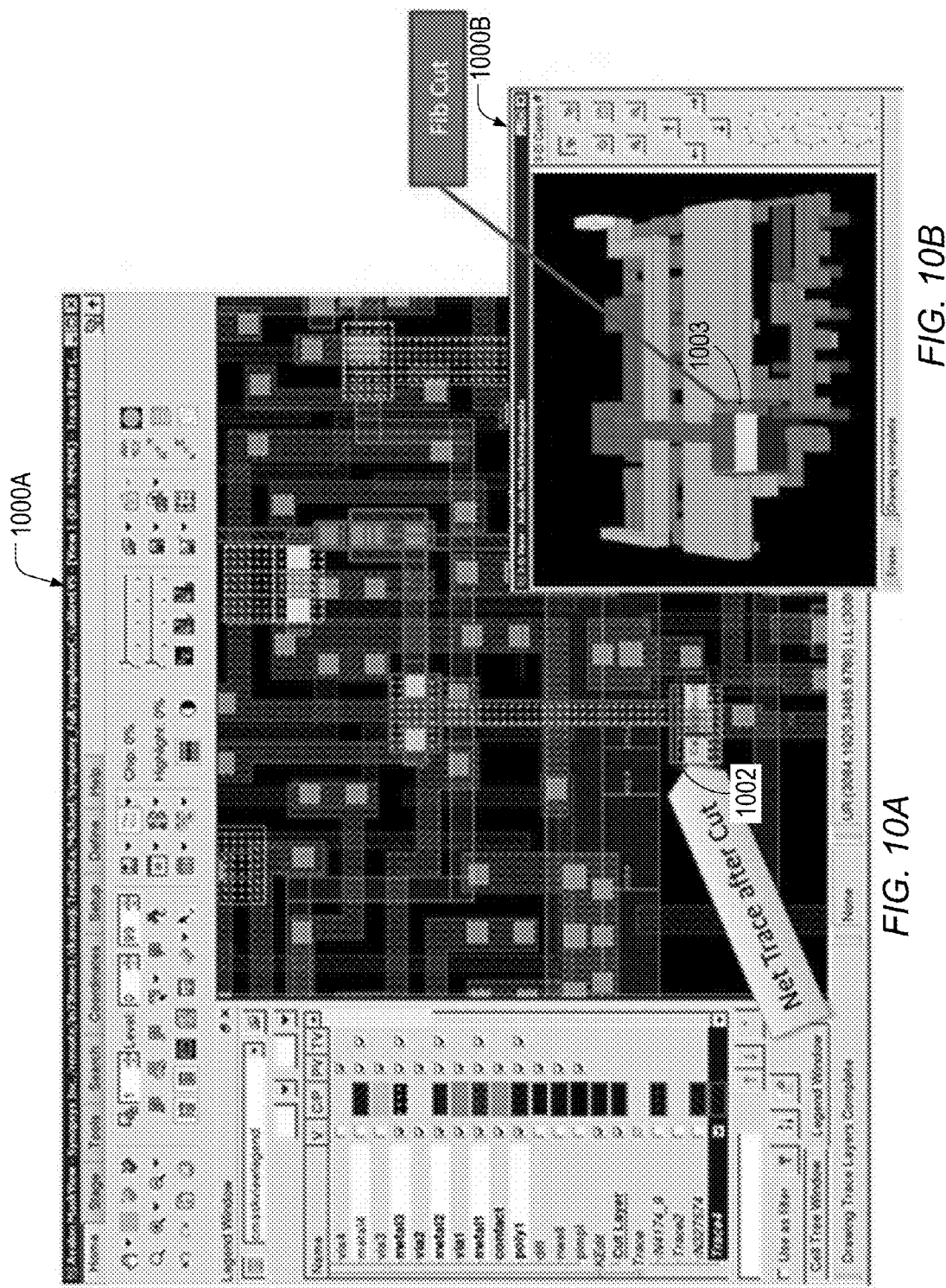
FIG. 10A depicts a simplified exemplary top layout view GUI of the second top layout view GUI previously depicted in FIG. 8A after the virtual cut described in FIGS. 9A and 9B is performed, in accordance with one embodiment of the present invention.
FIG. 10B depicts a simplified exemplary perspective 3D layout view GUI of the perspective 3D layout view GUI previously depicted in FIG. 8B after the virtual cut described in FIGS. 9A and 9B is performed, in accordance with one embodiment of the present invention.

FIG. 10A depicts a simplified exemplary top layout view GUI 1000A of the second top layout view GUI previously depicted in FIG. 8A after the virtual cut described in FIGS. 9A and 9B is performed, in accordance with one embodiment of the present invention. Top layout view GUI 1000A includes all the features and functions as top layout view GUI 800A previously depicted in FIG. 8A with the following exceptions. Top layout view GUI 1000A includes virtual cut edit box 1002 and highlights the resulting virtual cut net trace after the virtual cut with the polygon section below and including cut edit box 1002 not included in the virtual cut net.

FIG. 10B depicts a simplified exemplary perspective 3D layout view GUI 1000B of the perspective 3D layout view GUI 800B previously depicted in FIG. 8B after the virtual cut described in FIGS. 9A and 9B is performed, in accordance with one embodiment of the present invention. Perspective 3D layout view GUI 1000B includes all the features and functions as perspective 3D layout view GUI 800B with the following exceptions. Perspective 3D layout view GUI 1000B includes region 1003 depicted in grey to indicate the result of the virtual cut of metal traces 1 through 3 at that region. Accordingly, as is seen, embodiments of the present invention enable visualization of the electrical connectivity after a simulated FIB cut and/or deposit operation is performed.

Figure 11:
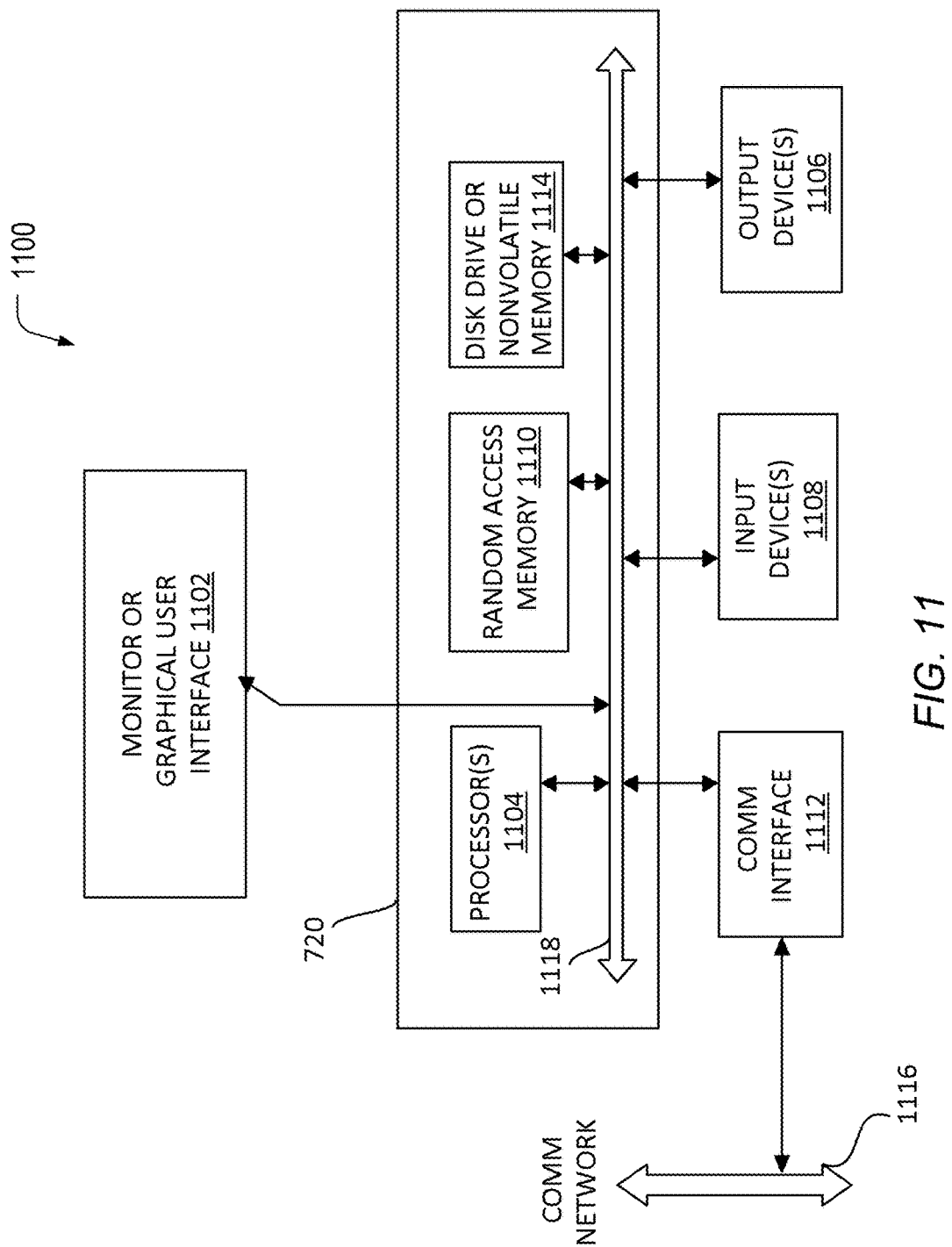
FIG. 11 is a block diagram of a computer system that may incorporate embodiments of the present invention.

FIG. 11 is an example block diagram of a computer system 1100 that may incorporate embodiments of the present invention. FIG. 11 is merely illustrative of a machine system to carry out aspects of the technical processes described herein, and does not limit the scope of the claims. One of ordinary skill in the art would recognize other variations, modifications, and alternatives. In one embodiment, the computer system 700 typically includes a monitor or graphical user interface 1102, a computer 1120, a communication network interface 1112, input device(s) 708, output device(s) 1106, and the like.

As depicted in FIG. 11, the computer 1120 may include one or more processor(s) 1104 that communicate with a number of peripheral devices via a bus subsystem 718. These peripheral devices may include input device(s) 1108, output device(s) 1106, communication network interface 1112, and a storage subsystem, such as a random access memory 1110 and a disk drive or nonvolatile memory 1114.

The input device(s) 1108 include devices and mechanisms for inputting information to the computer 1120. These may include a keyboard, a keypad, a touch screen incorporated into the monitor or graphical user interface 1102, audio input devices such as voice recognition systems, microphones, and other types of input devices. In various embodiments, the input device(s) 1108 are typically embodied as a computer mouse, a trackball, a track pad, a joystick, wireless remote, drawing tablet, voice command system, eye tracking system, and the like. The input device(s) 1108 typically allow a user to select objects, icons, text and the like that appear on the monitor or graphical user interface 1102 via a command such as a click of a button or the like.

The output device(s) 1106 include all possible types of devices and mechanisms for outputting information from the computer 1120. These may include a display (e.g., monitor or graphical user interface 1102), non-visual displays such as audio output devices, etc.

The communication network interface 1112 provides an interface to communication networks (e.g., communication network 1116) and devices external to the computer 1120. The communication network interface 1112 may serve as an interface for receiving data from and transmitting data to other systems. Embodiments of the communication network interface 1112 typically include an Ethernet card, a modem (telephone, satellite, cable, ISDN), (asynchronous) digital subscriber line (DSL) unit, FireWire interface, USB interface, and the like. For example, the communication network interface 1112 may be coupled to the communication network 1116 via a FireWire bus, or the like. In other embodiments, the communication network interface 1112 may be physically integrated on the motherboard of the computer 1120, and may be a software program, such as soft DSL, or the like.

In various embodiments, the computer system 1100 may also include software that enables communications over a network such as the HTTP, TCP/IP, RTP/RTSP protocols, and the like. In alternative embodiments, other communications software and transfer protocols may also be used, for example IPX, UDP or the like. In some embodiments, the computer 1120 in the processor(s) 1104 may include one or more microprocessors from Intel®. Further, one embodiment, the computer 1120 includes a UNIX-based operating system.

The random access memory 1110 and the disk drive or nonvolatile memory 1114 are examples of tangible media configured to store data and instructions to implement various embodiments of the processes described herein, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. The random access memory 710 and the disk drive or nonvolatile memory 1114 may be configured to store the basic programming and data constructs that provide the functionality of the disclosed processes and other embodiments thereof that fall within the scope of the present invention.

Software code modules and instructions that implement embodiments of the present invention may be stored in the random access memory 1110 and/or the disk drive or nonvolatile memory 1114. These software modules may be executed by the processor(s) 1104. The random access memory 1110 and the disk drive or nonvolatile memory 1114 may also provide a repository for storing data used by the software modules.

The random access memory 1110 and the disk drive or nonvolatile memory 1114 may include a number of memories including a main random access memory (RAM) for storage of instructions and data during program execution and a read only memory (ROM) in which fixed non-transitory instructions are stored. The random access memory 1110 and the disk drive or nonvolatile memory 1114 may include a file storage subsystem providing persistent (non-volatile) storage for program and data files. The random access memory 1110 and the disk drive or nonvolatile memory 1114 may include removable storage systems, such as removable flash memory.

The bus subsystem 1118 provides a mechanism for letting the various components and subsystems of computer 1120 communicate with each other as intended. Although the communication network interface 1112 is depicted schematically as a single bus, alternative embodiments of the bus subsystem 1118 may utilize multiple busses.

FIG. 11 is representative of a computer system capable of implementing embodiments of the present invention. It will be readily apparent to one of ordinary skill in the art that many other hardware and software configurations are suitable for use with embodiments of the present invention. For example, the computer may be a desktop, portable, rack-mounted or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc; and the like. Further, other types of operating systems are contemplated, such as Windows®, or the like from Microsoft Corporation, LINUX, UNIX, and the like. In still other embodiments, the techniques described above may be implemented upon a chip or an auxiliary processing board.

Various embodiments of the present invention may be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present invention. The logic may form part of a computer program product adapted to direct an information-processing device to perform a set of steps disclosed in embodiments of the present invention. Based on the disclosure and teachings provided herein, a person of ordinary skill in the art will appreciate other ways and/or methods to implement the present invention.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

The above descriptions of embodiments of the present invention are illustrative and not limitative. In addition, similar principles as described corresponding to latches and/or flops can be applied to other sequential logic circuit elements. Other modifications and variations will be apparent to those skilled in the art and are intended to fall within the scope of the appended claims.

What is claimed is:

1. A method comprising:
   performing a trace to highlight polygons of an input net when a computer is invoked to perform the trace;
   processing the polygons marked by edit boxes by a user;
   processing the net traced polygons as constrained by top and bottom layers set for the edit boxes;
   ending net tracing at the edit boxes having a cut type; and
   identifying an overlapping net on the edit boxes having a deposit type.

2. The method of claim 1, further comprising sending a machine control to affect the state of one or more machines.

3. The method of claim 1, wherein the trace is performed in a layout view.

4. The method of claim 1, wherein the trace is an online trace.

5. The method of claim 1, wherein the trace is a LVS trace.

6. A computing apparatus, the computing apparatus comprising:
   a processor; and
   a memory storing instructions that, when executed by the processor, configure the apparatus to:
      perform a trace to highlight polygons of an input net;
      process the polygons marked by edit boxes by a user;
      process net trace polygons as constrained by top and bottom layers set for the edit boxes;
      end net tracing at the edit boxes having a cut type; and
      identify an overlapping net on the edit boxes having a deposit type.

7. The computing apparatus of claim 6, wherein the instructions further configure the apparatus to send a machine control to affect the state of one or more machines.

8. The computing apparatus of claim 6, wherein the trace is performed in a layout view.

9. The computing apparatus of claim 6, wherein the trace is an online trace.

10. The computing apparatus of claim 6, wherein the trace is a LVS trace.

* * * * *